United States Patent
Centofante

[11] Patent Number: 6,137,224
[45] Date of Patent: *Oct. 24, 2000

[54] ELECTRONIC DEVICE ENCAPSULATED DIRECTLY ON A SUBSTRATE

[75] Inventor: Charles A. Centofante, Los Altos, Calif.

[73] Assignee: ITT Manufacturing Enterprises, Inc., Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 09/119,082

[22] Filed: Jul. 20, 1998

Related U.S. Application Data

[62] Division of application No. 08/763,538, Dec. 10, 1996, Pat. No. 5,833,903.

[51] Int. Cl.[7] ................................. H01J 1/62; H01J 63/04
[52] U.S. Cl. ...................... 313/510; 313/506; 313/512; 313/513
[58] Field of Search ..................... 313/500, 506, 313/510, 511, 512, 513; 445/24; 264/255, 272.16, 272.17, 1.7; 340/762, 786; 361/1; 228/6.2; 250/577; 257/99, 433, 81–82, 88, 680–81, 787; 438/5, 123; 425/116

[56] References Cited

U.S. PATENT DOCUMENTS

| | | |
|---|---|---|
| 3,650,648 | 3/1972 | Lambrecht . |
| 4,170,444 | 10/1979 | Fleming et al. . |
| 4,246,437 | 1/1981 | Frey et al. . |
| 4,349,693 | 9/1982 | Hinrichs . |
| 4,463,398 | 7/1984 | Boozer et al. ................. 361/1 |
| 4,463,399 | 7/1984 | Matherly et al. ............... 361/1 |
| 4,810,831 | 3/1989 | Hendel . |
| 4,915,607 | 4/1990 | Medders et al. . |
| 4,954,308 | 9/1990 | Yabe et al. . |
| 4,996,577 | 2/1991 | Kinzer ........................ 257/82 |
| 5,105,238 | 4/1992 | Nikaido et al. ............... 257/82 X |
| 5,167,556 | 12/1992 | Stein . |
| 5,226,052 | 7/1993 | Tanaka et al. ................ 257/82 X |
| 5,265,792 | 11/1993 | Harrah et al. ................. 228/6.2 |
| 5,278,426 | 1/1994 | Barbier ........................ 250/577 |
| 5,315,491 | 5/1994 | Spencer et al. ............... 313/512 |
| 5,316,463 | 5/1994 | Neu . |
| 5,326,243 | 7/1994 | Fierkens . |
| 5,336,456 | 8/1994 | Eskildsen et al. . |
| 5,429,488 | 7/1995 | Neu . |
| 5,460,502 | 10/1995 | Majercak . |
| 5,475,241 | 12/1995 | Harrah et al. ................. 257/99 |
| 5,585,695 | 12/1996 | Kitai .......................... 313/512 X |
| 5,661,364 | 8/1997 | Kruskopf ..................... 313/512 |
| 5,665,983 | 9/1997 | Nagano ........................ 257/82 |
| 5,703,394 | 12/1997 | Wei et al. ..................... 257/433 |
| 5,734,225 | 3/1998 | Biebuyck et al. ............. 313/512 |
| 5,747,363 | 5/1998 | Wei et al. ..................... 438/5 |
| 5,789,280 | 8/1998 | Yokota ......................... 438/123 |
| 5,855,924 | 1/1999 | Lumbard ...................... 425/116 |

*Primary Examiner*—Nimeshkumar D. Patel
*Assistant Examiner*—Mack Haynes
*Attorney, Agent, or Firm*—Fish & Richardson P.C.

[57] ABSTRACT

A method and apparatus for encapsulating one or more small electronic devices, including for example light-emitting diodes, mounted directly on a substrate by providing a three-dimensional formation on the substrate adjacent to the device and injection molding a thermoplastic encapsulating material to cover the device and extend over the three-dimensional formation on the substrate and wherein the encapsulating material mechanically bonds to the three-dimensional formation. A gate plate for use in injection molding a thermoplastic encapsulating material over a small electronic device mounted directly on a substrate including a cavity formed to enclose the device, and a short gate formed entirely within the gate plate having an input for receiving an encapsulating material and an output communicating with the cavity. One or more encapsulated electrical devices mounted directly on a substrate, including, for example, an LED or an array of LEDs, wherein the device is fully and individually encapsulated by an encapsulating material which is injection molded onto and mechanically bonded to the substrate.

5 Claims, 10 Drawing Sheets

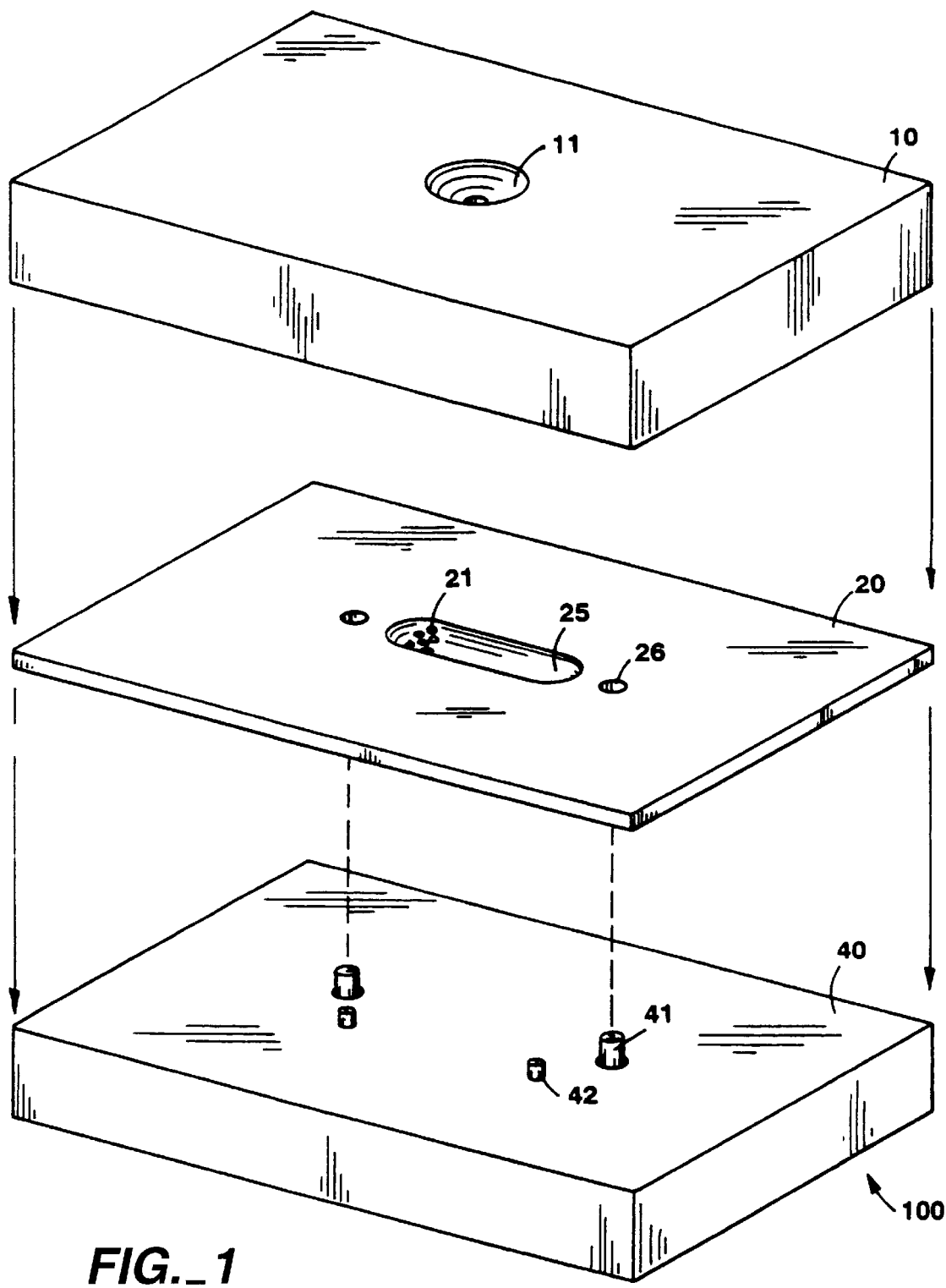
FIG._1

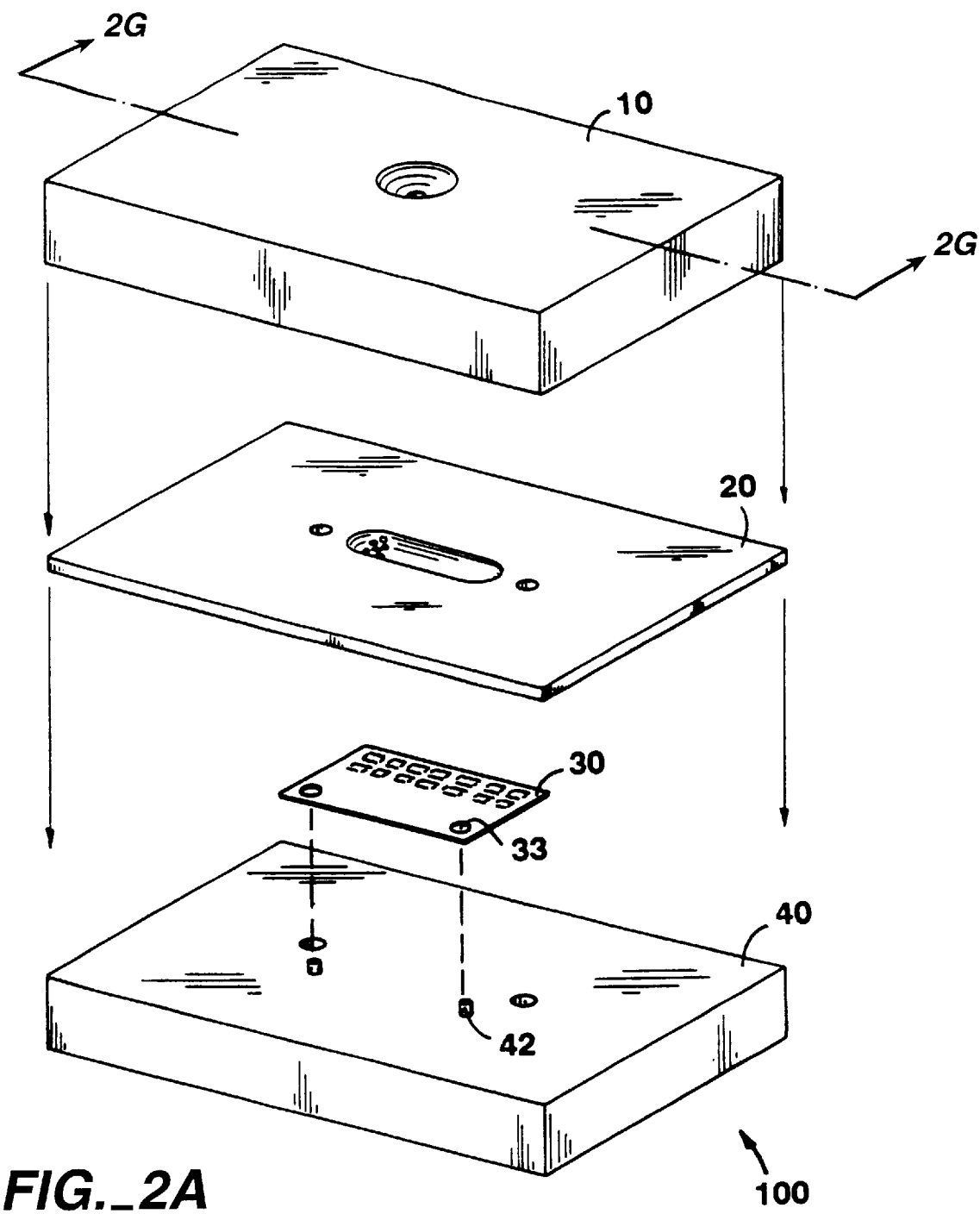
FIG._2A

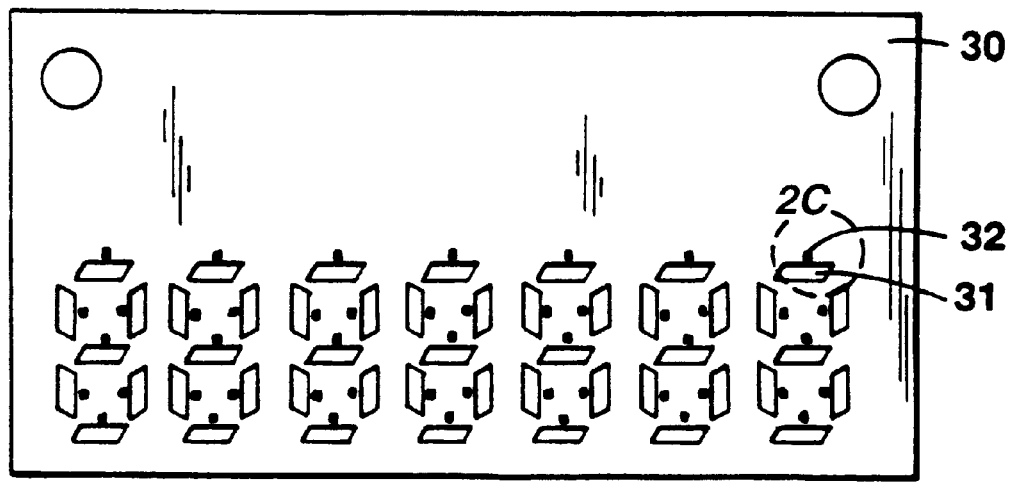
FIG._2B
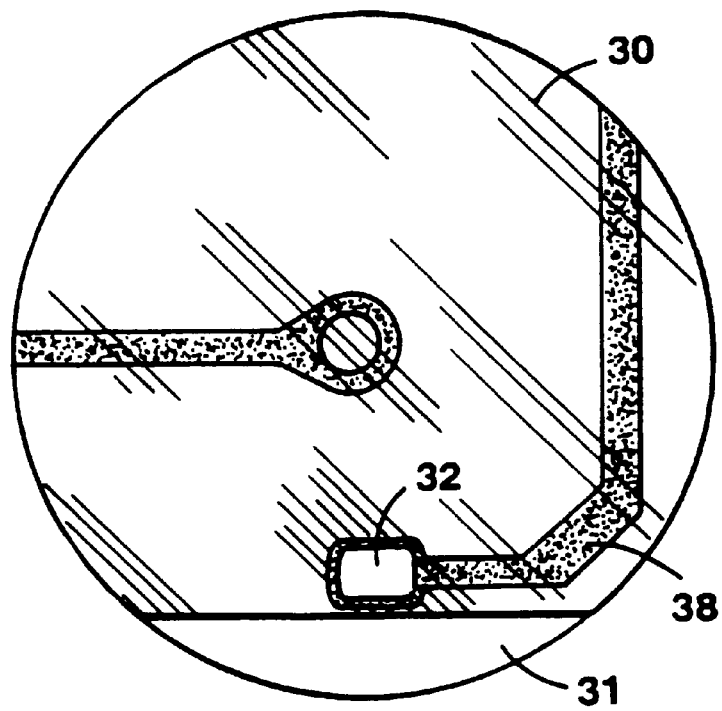
FIG._2C

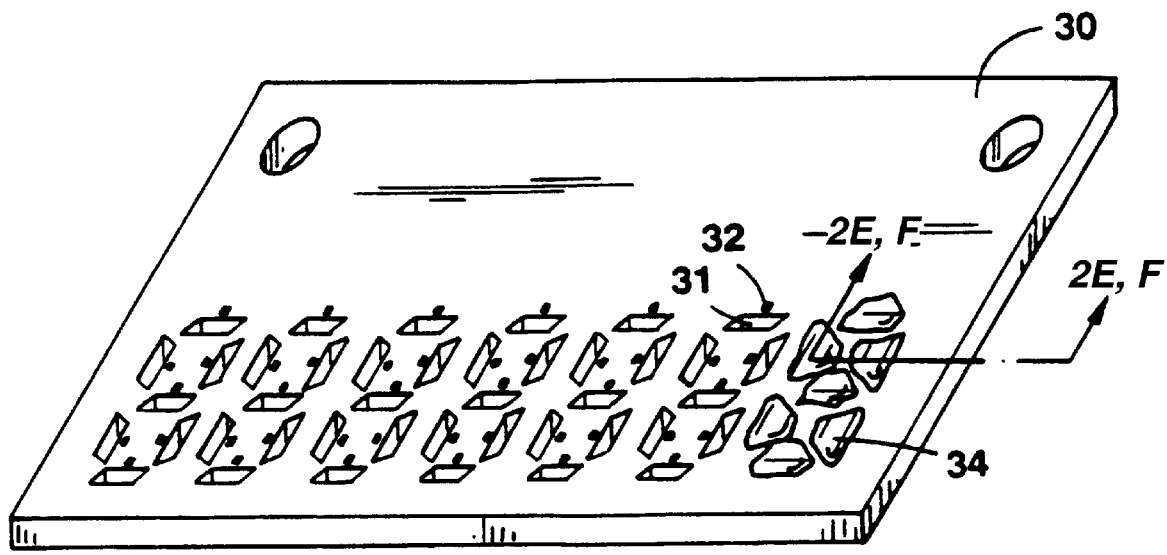
FIG._2D
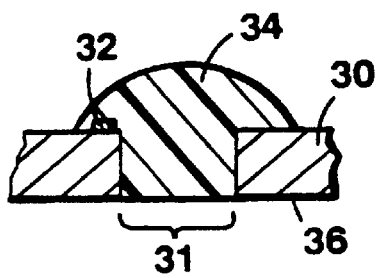
FIG._2E
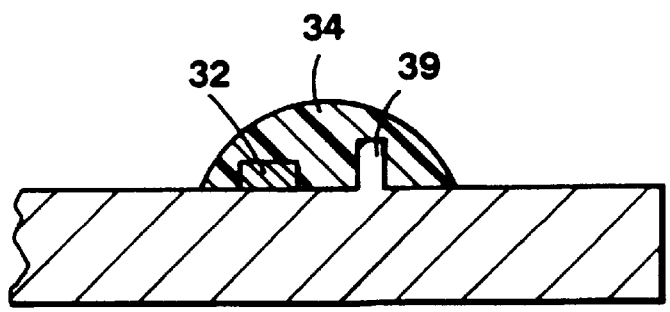
FIG._2F

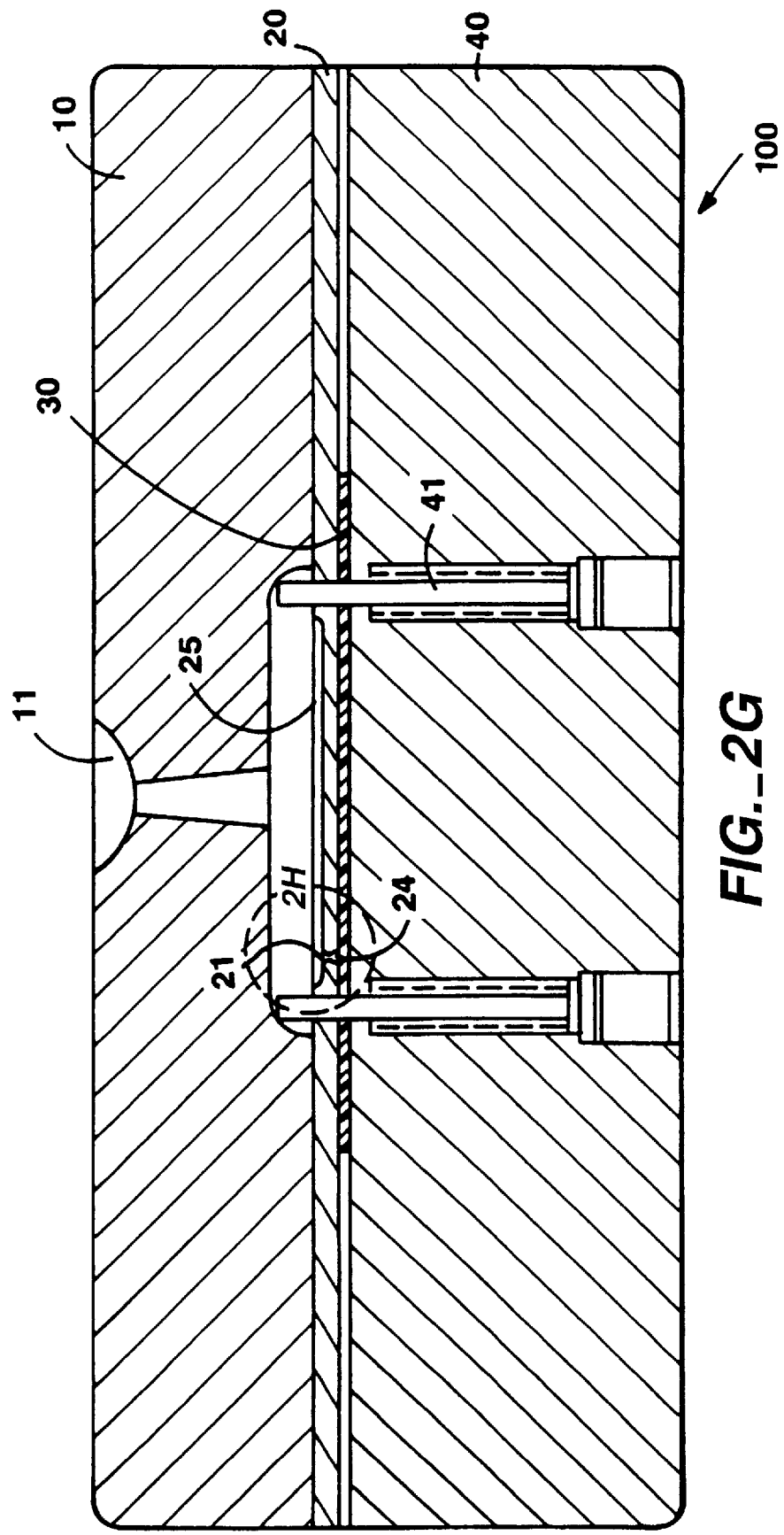
FIG._2G

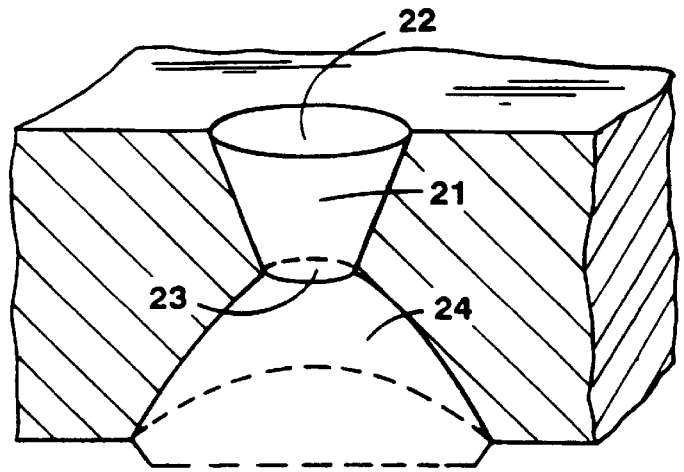
FIG._2H
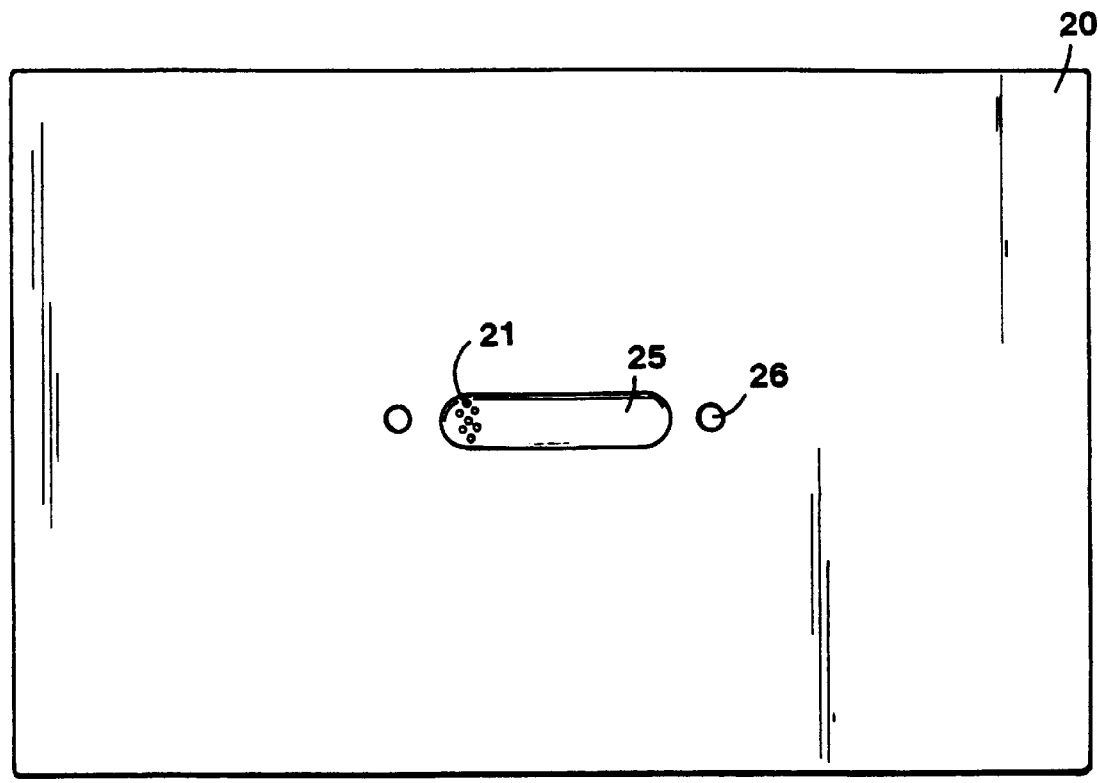
FIG._2I

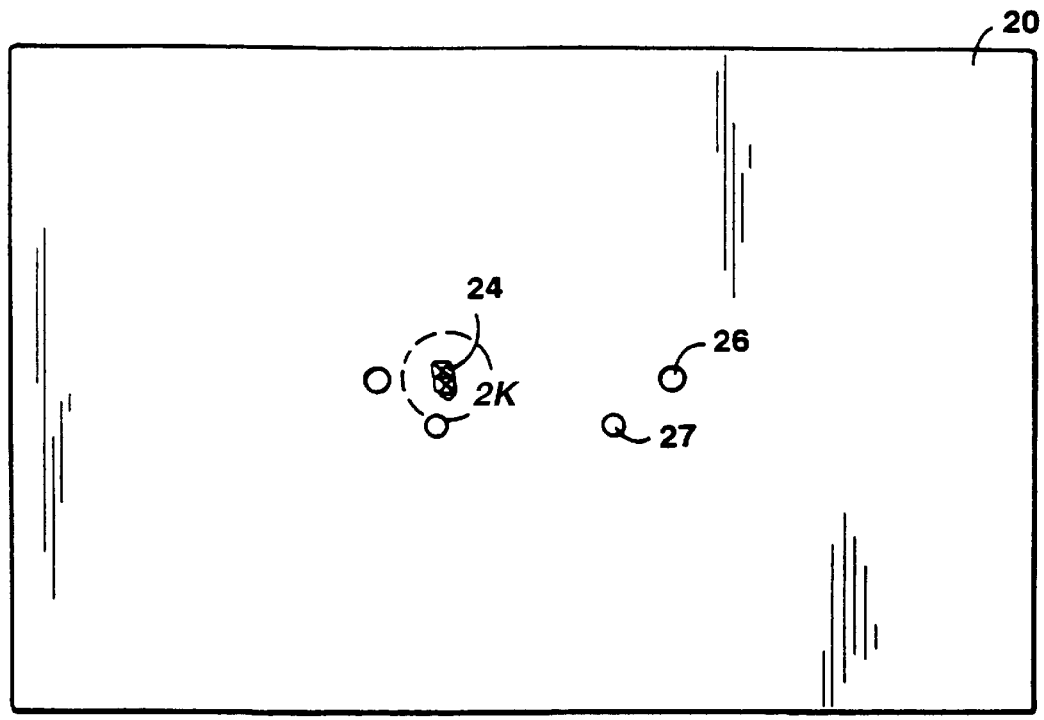
FIG._2J
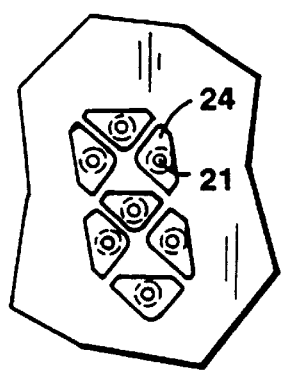
FIG._2K
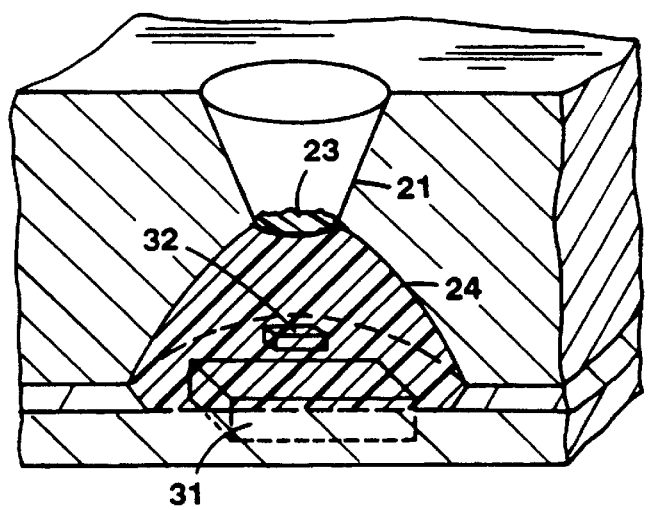
FIG._2M

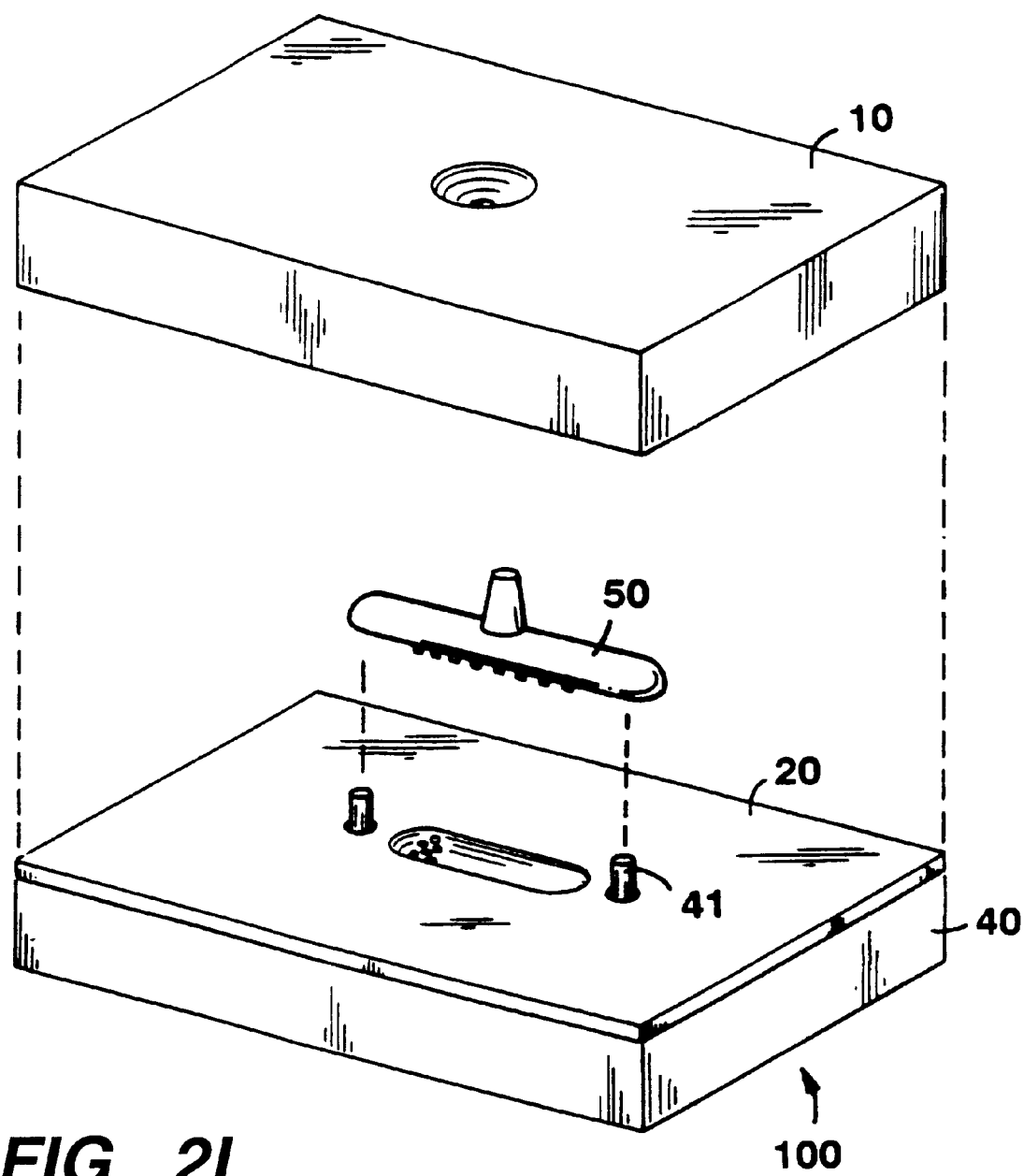
FIG._2L

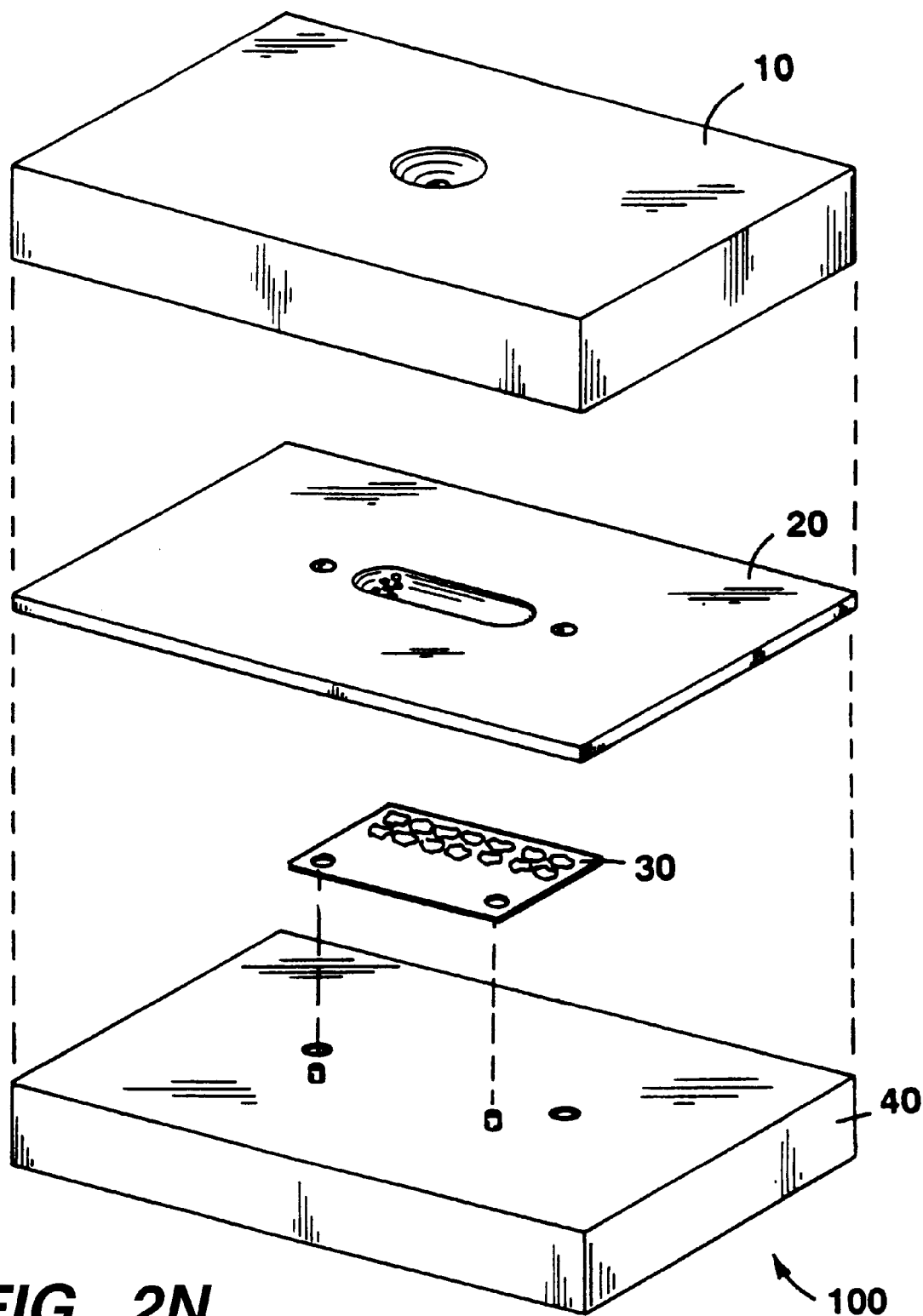
FIG._2N

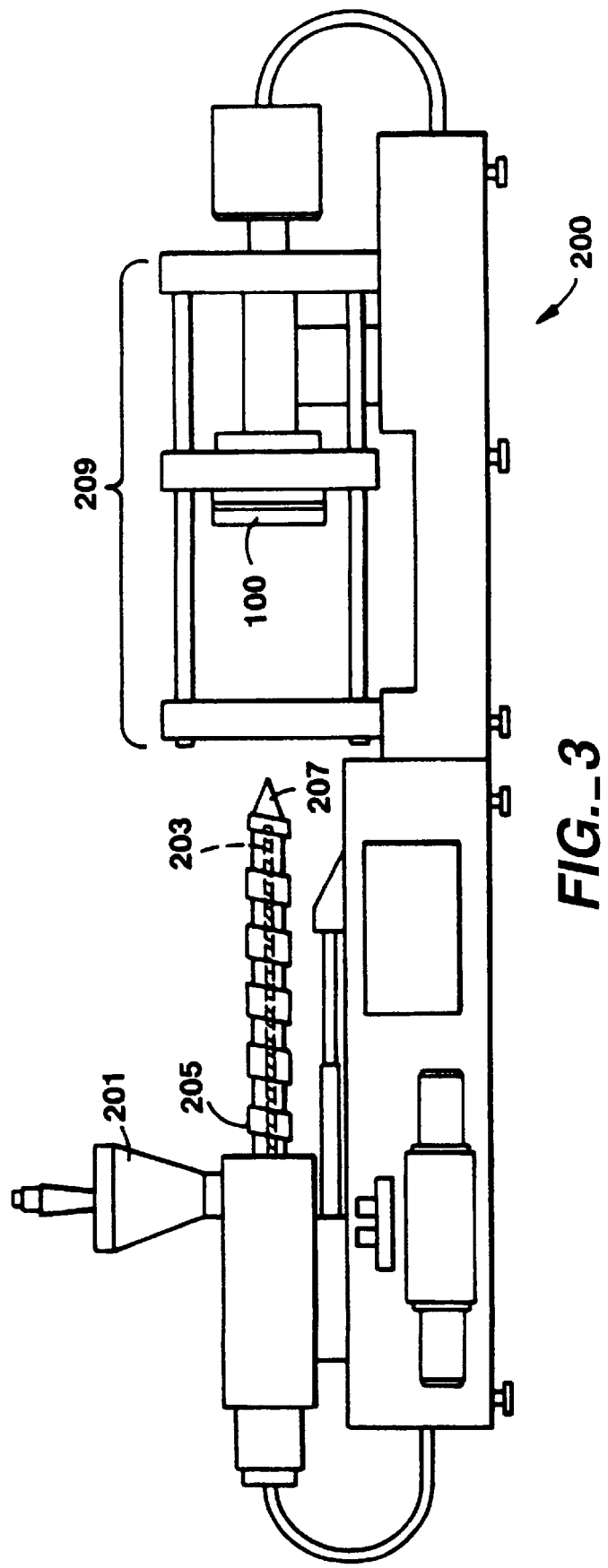
FIG._3

ELECTRONIC DEVICE ENCAPSULATED DIRECTLY ON A SUBSTRATE

This is division of U.S. Application Ser. No. 08/763,538, filed Dec. 10, 1996 now U.S. Pat. No. 5,833,903.

BACKGROUND

The invention relates to plastic encapsulation of electronic devices, and more specifically, to injection molding an encapsulation for an electronic device directly onto a substrate such as a printed circuit board.

It is well known that electronic devices are sensitive to the environment and that exposure to normal atmospheric conditions may degrade or ruin them entirely. Accordingly, it is the current practice to protect electronic devices from environmental/atmospheric exposure by sealing them within a protective enclosure, commonly made of a non-electrically conducting material such as a plastic resin, with an interfacing means, such as pins, to allow connection of the devices to a larger electronic circuit or other devices. Simple devices such as resistors, capacitors, diodes and the like, as well as more complex semiconductor devices, or chips, are commonly packaged in this manner.

It is common practice to interface such an encapsulated device with other devices mounted on a supporting substrate by, for example, inserting its interface pins into a corresponding socket mounted on the substrate. These other devices are similarly mounted and connected to each other with wires, or with traces in the case where the substrate is a printed circuit board.

This practice of encapsulation suffers from a number of drawbacks. Generally, the equipment and materials necessary to accomplish the encapsulation must be located outside of the clean room environment where the device itself is manufactured, and the encapsulation must therefore be performed as a separate manufacturing step. The encapsulating process is also expensive. Further, the plastic packages themselves, with the required interface means, significantly increase the size of the device, thereby requiring a larger area, or more real estate, for their incorporation in another device or circuit.

Alternatively, it is known that certain electronic devices may be mounted to a substrate such as a printed circuit board, typically with gold wire connections, and encapsulated by a liquid resin that is hand cast over the device on the substrate. This procedure is not preferred because it is expensive, time-consuming, difficult to accurately place the cast material over the device, and provides poor adhesion of the cast material to the substrate. Further, the gold wire connections to the device are very delicate and are easily disconnected during the casting process.

Another prior-art method for encapsulating devices mounted onto a substrate by gold wires is the so-called "transfer molding" method. Transfer molding is a process by which a thermosetting material is caused to flow into a cavity formed by the cooperation of a mold and a cavity plate. The material enters the cavity through so-called "side" gates which are also formed by the space between the cavity plate and the mold. This method is an improvement over the hand-casting encapsulation method because it allows multiple devices to be encapsulated at the same time in one production cycle and it allows for somewhat more accurate placement and size of the resulting encapsulated package.

Transfer molding, however, itself suffers from a number of significant drawbacks which are eliminated by the present invention. Initially, transfer molding techniques of encapsulating electronic devices are limited to use of thermosetting materials which have a low viscosity. Such a material is necessary to prevent damage to the delicate connections of the device to the substrate during the molding process. This same danger requires that the encapsulating material be forced into the mold at low pressure. Use of a low viscosity thermoset results in the need for an expensive mold apparatus which must be constructed with very high tolerances to prevent leakage of the encapsulating material. Even the most expensive molds, however, exhibit some leakage in the area of the gate and device connections which must be removed by additional process steps after molding, thereby increasing cycle times.

Use of a thermoset, which cures by a chemical process, also results in long cycle times, on the order of 5 to 15 minutes, which increases production costs. Thermoset materials themselves are expensive due, in part, to the inability to reuse excess encapsulating material resulting from the molding process after the material has cured.

Use of a low viscosity thermoset at low insertion pressure also results in the need for large side entry gates for the encapsulating material. The large side gates make transfer molding impractical for small devices because the size of the gate limits the size of the cavity. The gating used in transfer molding techniques adds further limitations to the placement and configuration of the devices to be encapsulated because it requires the devices to be near an edge of the substrate to which it is to be bonded. Typical transfer molding applications therefore involve devices which are mounted in a linear arrangement on a substrate with the use of strip-like carriers, or "lead frames," for the devices. Transfer molding with thermosets is also not useful with small devices because the thermosetting material requires substantial surface area in contact with the substrate in order to adhere sufficiently to hold the device and encapsulate to the substrate with a chemical or adhesive bond.

On the other hand, use of higher viscosity thermoplastic materials is not practical in transfer molding because it requires higher pressures that may damage the device connections and may result in additional leakage of the encapsulating material. Further it is difficult in a transfer molding apparatus to maintain the high temperatures required to allow a thermoplastic material to properly flow.

Attempts have been made to solve the problems with prior-art encapsulating methods by use of injection molding. Prior art injection molding methods, however, suffered from similar drawbacks. Although higher pressures may be used with injection molding and thus would allow use of thermoplastic materials, the injection process would damage the delicate device connections. In addition, prior art injection molding methods and devices were not useful for small devices because the smaller gating necessitated by smaller cavities had a tendency to clog with the thermoplastic material and this material exhibited poor adhesion resulting in devices being separated from the substrate.

SUMMARY

In general, in one aspect, the invention features a method of encapsulating a small electronic device mounted directly on a substrate by providing a three-dimensional formation on the substrate adjacent to the device and injection molding a thermoplastic encapsulating material to cover the device and extend over the three-dimensional formation on the substrate and wherein the encapsulating material mechanically bonds to the three-dimensional formation. In another aspect, the invention features a method of encapsulating a light emitting diode (LED) mounted directly on a substrate by providing a hole through the substrate adjacent to the LED and injection molding a light-transmissive thermoplastic encapsulating material to cover the LED and fill the hole. In another aspect the invention features a method of encapsulating a set of LEDs mounted directly to a printed circuit board (PCB) and arranged to form an alphanumeric display by providing a hole through the PCB adjacent to each of the LEDs, injection molding a light-transmissive thermoplastic around each of the LEDs and wherein each of the LEDs is separately encapsulated in a package that is shaped to focus and reflect light from the LED and is mechanically bonded to the PCB. In a further aspect, the invention features a method of encapsulating a plurality of small electronic devices mounted directly on a substrate in close proximity to one another comprising providing a three-dimensional formation on the substrate adjacent to each device, injection molding a thermoplastic encapsulating material to individually cover each device and wherein the encapsulating material mechanically bonds to the three-dimensional formation on the substrate.

In another aspect the invention features a mold for injection molding a thermoplastic encapsulating material over a small electronic device mounted directly on a substrate, the mold comprising a base member, a top member including an inlet, and a gate plate including a short gate having an input communicating with the inlet and an output communicating with a cavity, and wherein the gate is formed entirely within the gate plate. In another aspect the invention features a gate plate for use in injection molding a thermoplastic encapsulating material over a small electronic device mounted directly on a substrate comprising a cavity formed to enclose the device, and a short gate having an input for receiving an encapsulating material and an output communicating with the cavity, and wherein the gate is formed entirely within the gate plate. In a further aspect, the invention features a gate plate for use in injection molding a light-transmissive thermoplastic encapsulating material over a set of LEDs mounted directly on a substrate comprising a set of cavities arranged in the form of an alphanumeric display, each cavity formed to enclose one LED and extend over its adjacent hole and a set of short conical gates, each having an input for receiving an encapsulating material and an output communicating with a cavity, and wherein the gates are formed entirely within the gate plate.

In another aspect, the invention features an encapsulated electrical device mounted directly on a substrate wherein the device is fully encapsulated by an encapsulating material which is injection molded onto and mechanically bonded to the substrate. In a further aspect, the invention features an alphanumerical display comprising a set of LEDs mounted directly to a PCB with holes through the PCB adjacent to each of the LEDs and arranged to form a display and wherein each of the LEDs is separately encapsulated in a package of light-transmissive material that has been molded onto and mechanically bonded to the PCB.

Preferred embodiments of the invention include one or more of the following features. A three-dimensional feature on the substrate adjacent to the device to be encapsulated where the three-dimensional feature is optionally a hole, a raised member extending above the surface of or a groove extending below the surface of the substrate. A substrate comprising a printed circuit board. An encapsulating material comprised of a thermoplastic resin chosen from among the groups of polycarbonates and acrylics. A method wherein, after injection, the encapsulating material is located on less than the entire surface of the substrate. Encapsulating a light emitting diode in a light-transmissive encapsulating material. Encapsulating on a PCB a light emitting diode using a lozenge shaped hole adjacent to the LED and wherein, after encapsulation, the encapsulating material on the side of the PCB opposite from the light emitting diode is substantially flat and flush with the surface of the printed circuit board. Encapsulating a plurality of LEDs on a PCB in the form of an alphanumeric display including, for example, a seven segment display. Encapsulating a plurality of devices arranged in a non-uniform arrangement on a substrate and wherein one or more of the devices are located away from the edges of the substrate. A gate plate having a substantially conical gate. A gate having a cross sectional area that is reduced from the input to the output to form a region of relatively reduced strength in hardened encapsulating material, whereby the material is caused to break off near to the output of the gate when the mold is opened. A gate having sidewalls that are inclined about 15 degrees over the length of the gate from the input to the output. A gate plate about 0.250 inches thick. A gate plate including a distribution runner connected to the gate. A gate about 0.065 inches long. A set of cavities arranged in the form of an alphanumeric display. A set of cavities arranged in the form of a seven-segment display. A cavity shaped to form a package of encapsulating material that focuses and reflects light from a light emitting diode out of an adjacent hole in the substrate. A cavity having a base opposite from the output of the gate, which base is substantially triangular with rounded corners and which cavity is substantially rounded above its base. An encapsulated electrical device mounted directly on a substrate wherein the device is fully encapsulated by an encapsulating material. An alphanumerical display comprising an array of light emitting diodes separately encapsulated in a package of light-transmissive thermoplastic material.

Among the advantages of the invention are one or more of the following. The invention eliminates the need for separate, expensive and time-consuming encapsulation of electronic devices. The invention eliminates the need for pin interfaces on circuit boards. The invention reduces the amount of space required on a circuit board for a given electronic device. In one aspect, the invention provides an injection molding method where the encapsulating material hardens quickly by loss of heat, without leakage of material, thereby increasing production speed and capacity. The invention increases production speed by eliminating the need to mill excess encapsulating material after molding. The invention allows for economical reuse and recycling of a thermoplastic encapsulating material. In another aspect, the invention provides apparatus for injection molding that is efficient and economical. In another aspect, the invention provides an injection mold with a thin gate plate that is separate from the larger top and bottom plates of the mold and that may be designed to be constructed of relatively inexpensive material and therefore economically replaced when worn. The invention further provides an injection molding apparatus that allows placement of an encapsulating material in any location and in any configuration on a substrate. In another aspect the invention provides an injection molding apparatus that allows many small devices to be individually encapsulated in close proximity to one another. The invention alleviates the potential problems of wires or traces being torn or disconnected from the device and prevents the device from being separated from the substrate by making use of small devices that may be mounted directly to the substrate without wires and by mechanically bonding the encapsulated material to the substrate. In another aspect, the invention quickly and economically encapsulates a light emitting diode on a printed circuit board using a minimum of real estate. The invention further provides an alphanumeric display economically constructed on a printed circuit board by injection molding a separate encapsulation around each of an array of LEDs mounted directly to the board. Other features and advantages of the invention will become apparent from the following description and from the claims.

BRIEF DESCRIPTION OF THE DRAWINGS

FIG. 1 is an exploded view of a mold for injection molding a package of an encapsulating material for an electronic device onto a substrate.

FIG. 2A is an exploded view of the mold of FIG. 1 with a substrate in position to be injection molded.

FIG. 2B is a detailed view of the substrate of FIG. 2A.

FIG. 2C is a more detailed view of a single LED mounted to the substrate of FIG. 2B.

FIG. 2D is a detailed view of the substrate of FIG. 2B including the molded package.

FIG. 2E is a section view of the substrate of FIG. 2D.

FIG. 2F is a view of an alternate embodiment of the substrate of FIG. 2D with a raised member on the substrate instead of a hole.

FIG. 2G is a sectional view of the mold of FIG. 2A.

FIG. 2H is an enlarged view of the gate and cavity of the mold of FIG. 2G.

FIG. 2I is a view of the top of the gate plate of the mold of FIG. 2A.

FIG. 2J is a view of the bottom of the gate plate of the mold of FIG. 2A.

FIG. 2K is a detailed view of the cavities and gates of the gate plate of FIG. 2I.

FIG. 2L illustrates the removal of excess encapsulating material.

FIG. 2M is an enlarged view of the gate and cavity of the mold of FIG. 2G shown in place above the substrate of FIG. 2D after injection and after the removal of excess encapsulating material.

FIG. 2N is an exploded view of the mold of FIG. 2A with the package molded to the substrate.

FIG. 3 is a diagram of the mold of FIG. 1 in place in an injection molding apparatus.

DETAILED DESCRIPTION

Referring to FIG. 1, mold 100 includes top plate 10, gate plate 20 and base plate 40. Top plate 10 includes inlet 11 that provides a path for injecting an encapsulating material into mold 100. Gate plate 20 includes gates 21, distribution runner 25 and ejection holes 26. Gates 21 communicate with inlet 11 through optional distribution runner 25. Alternatively, gates 21 may communicate directly with inlet 11. However, use of distribution runner 25 improves the flow of an encapsulating material to gates 21 and facilitates the creation of shorter gates. Base plate 40 includes ejection pins 41 and locating pins 42.

Referring to FIG. 2A, substrate 30 is positioned within mold 100 by being placed on base plate 40 so that locating holes 33 fit over locating pins 42. Gate plate 20 is placed on top of substrate 30 and top plate 10 is placed on top of gate plate 20. (Substrate 30 is not part of mold 100).

Referring to FIG. 2B, substrate 30 is a printed circuit board as is well known, and light emitting diodes ("LEDs") 32 are mounted directly to substrate 30. Small electronic devices such as LEDs 32 may be mounted directly to substrates without the need for delicate gold wire connections. The connections may be made "pad-to-pad", i.e., between conductive surfaces on the upper surface of the substrate and on the bottom surface of the device itself. Mounting of the device directly to the substrate without delicate gold wires eliminates the prior art problem of damage to these connections which occurred during the molding of an encapsulation.

Substrate 30, additionally includes a three-dimensional formation adjacent to each LED 32. As shown, this three-dimensional formation comprises holes 31 through substrate 30. In addition to a printed circuit board, substrate 30 may, alternatively, be any suitable electrically insulating material and may be, for example, a bread-board, a plastic plate, a piece of glass, a coated metal plate or other mounting surface. In the specific LED application shown, holes 31 are lozenge shaped and arranged to form the familiar seven-segment arrangement of numeric displays. Each LED 32 has a corresponding hole 31 adjacent to it. Other arrangements of holes and LEDs may be contemplated that may be used to form more generalized alphanumeric displays. For example, a simple rectangular array or grid of LEDs may be used to generate a wide variety of characters and the implementation of such alphanumeric displays is well known.

Referring to FIG. 2C LED 32 is connected to trace 38 which electrically connects LED 32 so LED 32 may be used as part of a completed circuit. Each LED 32 is similarly connected to its own trace 38 formed in substrate 30 which is a printed circuit board.

Referring to FIG. 2D, after completion of the encapsulation process, a package of hardened encapsulating material 34 completely encloses LED 32. The package of encapsulating material 34 also fills hole 31. Holes 31 promote the bonding of package 34 to substrate 30. As it hardens, the encapsulating material shrinks and forms a mechanical bond with the substrate at hole 31. This mechanical bonding allows for very small devices to be encapsulated and strongly held to the substrate. Although shown of a shape and size to form a seven-segment display, when devices other than LEDs are being encapsulated, holes 31 need only be of sufficient number, size and placement to insure adequate bonding of the encapsulating material. The specific number, size and placement will be determined, in turn, by the size and shape of the device being encapsulated.

FIG. 2D shows that one set of seven LEDs has been encapsulated. However, the encapsulation of a single device, several devices, or all the devices on substrate 30 may be accomplished in one injection cycle. In practice, a large number of sets of LED 32, on multiple substrates, will be encapsulated in one injection cycle.

Substrate 30 may contain any kind of small electronic device to be encapsulated. LED 32 is shown by way of example only and the disclosed method and apparatus may be used to quickly and economically injection mold a package of any shape around any kind of device that may be directly connected to a substrate. For example, simple devices such as resisters or capacitors as well as more complex devices such as Random Access Memory ("RAM"), microprocessors, or any other electronic devices may be encapsulated in a similar fashion. The disclosed method and apparatus are especially useful in encapsulating a number of very small electronic devices (on the order of approximately 12/1000 inch in diameter and larger) that are to be placed in close proximity to one another on the same substrate (within approximately 12/1000 inch from one another and further apart).

The encapsulation of the device is advantageously accomplished by mechanically bonding the encapsulating material directly to the substrate. In one example shown in FIG. 2A, this bonding is accomplished by the use of holes 31 in substrate 30 which retain the encapsulating material as it shrinks during hardening and promotes the formation of a mechanical bond. Holes 31 may be of any shape and may be created through any method, for example, with a punch, a laser, or by etching, milling or routing the substrate. An added advantage to using holes 31 in substrate 30 to aid the encapsulation of LED 32, as contrasted with other three-dimensional formations discussed below, is that the LED's 32 light may be transmitted through the holes 31 from the LED 32 mounted on the back side of substrate 30.

This mechanical bonding of the encapsulating material to the substrate may also be promoted by other three-dimensional formations on the substrate such as, for example, raised members extending above the surface of the substrate that "grip" the encapsulating material as it shrinks during hardening, or recesses extending below the surface of the substrate that retain the encapsulating material in a manner similar to that of holes 31. The mechanical bonding allows for very small devices to be encapsulated in small packages wherein only a small contact surface exists between the encapsulating material and the substrate. Such a small contact surface, on the other hand, prevents the formation of an adhesive or chemical bond which has adequate strength alone to hold a device and package to the substrate.

Referring to FIG. 2E, the package of hardened encapsulating material 34 can be more easily seen to completely enclose LED 32. The package of hardened encapsulating material 34 also fills in hole 31 and forms a surface flush with the bottom surface 36 of substrate 30. The shape of the package will be determined by the shape of the cavity of gate plate 20. The configuration of these cavities will be discussed in more detail below. As shown in FIG. 2D, package 34 is substantially triangular with rounded corners at the surface of substrate 30 and is rounded as it rises above the surface to form a roughly semi-spherical shape. The shape and composition of the package of hardened encapsulating material 34 also acts to focus and reflect light transmitted from LED 32 out hole 31. In an application using an LED, this configuration allows the bottom surface 36 of substrate 30 to be the "face" of the device and provide a desireable flat display.

Referring to FIG. 2F, the three-dimensional formation may be embodied as a raised member 39 on substrate 30 adjacent to LED 32. The package of hardened encapsulating material 34 forms a mechanical bond with substrate 30 and raised member 39 in a manner similar to that described above when hole 31 is provided.

Referring to FIG. 2G, a section view of mold 100, substrate 30 is positioned on top of base plate 40 within closed mold 100. Gate plate 20 includes gate 21 and cavity 24. Gate 21 communicates with inlet 11 through distribution runner 25. Cavity 24 communicates with gate 21. Gate plate 20 is positioned so that ejection holes 26 are located over ejection pins 41 of base plate 40. Ejection pins 41 are spring-loaded and, when extended, extend completely through ejection holes 26 and above gate plate 20. When mold 100 is closed, ejection pins 41 are compressed downward by the weight of top plate 10.

Referring to FIG. 2H, as shown, gate 21 is conical in shape and includes an input 22 and an output 23. Input 22 communicates with inlet 11 of top plate 10 through distribution runner 25. Output 23 communicates with cavity 24. The cross-sectional area of gate 21 decreases from input 22 to output 23. This reduction of cross-sectional area results in a region of reduced strength in the hardened encapsulating material near output 23. In one embodiment, gate 21 has a substantially round input 22 with a cross-sectional area of about 0.000615 square inches and a substantially round output 23 with a cross-sectional area of about 0.000113 square inches, and is about 0.065 inches long, which provides the intended region of reduced strength near output 23 in a thermoplastic encapsulating material such as Lexan™, a polycarbonate available from General Electric. Alternatively stated, a gate having side walls 28 that are inclined about 15 degrees over their length from the inlet to the outlet will provide the desired shape.

Referring again to FIG. 2G, in operation, mold 100 is closed with substrate 30 positioned inside. Substrate 30 rests on rigid base plate 40. An encapsulating material (not shown) is injected into mold 100 through inlet 11 in top plate 10. The encapsulating material may be any thermoplastic resin, such as, for example, polycarbonate or acrylic. Use of thermoplastic resins is advantageous because they harden by loss of heat typically in a few seconds and thus provide for very short cycle times. Further, excess thermoplastic material not forming part of the encapsulating package may be recycled and reused simply by reheating. In addition, the shrinking of a thermoplastic as it cools allows for the formation of a strong mechanical bond to the substrate as discussed above.

When injection molding a package particularly around a light emitting device, such as a LED, or light receiving device, such as a photodiode, the encapsulating material must be sufficiently transparent. A variety of transparent and translucent plastic resins are available that meet the required characteristics. A polycarbonate resin, such as Lexan™, for example, available from General Electric, is suitable for encapsulating an LED.

Referring again to FIGS. 2G and 2H, the injected encapsulating material passes through inlet 11 into distribution runner 25 and from there through input 22 into gate 21 and through output 23 to cavity 24. Enough encapsulating material is injected to completely fill cavity 24, gate 21, distribution runner 25 and part of inlet 11. Each cavity 24 is formed so that the encapsulating material flows in and around a corresponding hole 31 in substrate 30. The high viscosity of the thermoplastic encapsulating material prevents it from leaking beyond the boundaries formed by cavity 24 and hole 31. In addition, the pressure of the mold is sufficient to form a seal between the substrate 30 and base plate 40 and cavity 24 and substrate 30 to contain the injected thermoplastic. Once fully injected, the encapsulating material is allowed to harden. This hardening may be accomplished through loss of heat in a matter of seconds when the appropriate thermoplastic resin is chosen as the encapsulating material.

Referring to FIG. 2I, the top portion of gate plate 20 includes gates 21, distribution runner 25 and ejection holes 26. Referring to FIG. 2J, the bottom portion of gate plate 20 further includes cavities 24 and locator holes 27. When positioned in mold 100, locator holes 27 fit over locator pins 42 in base plate 40.

To encapsulate a small device, one requires a small cavity 24 and small gate 21. With very small gates, the gate tends to clog or freeze off, preventing the flow of encapsulating material. This tendency may be overcome by making the length of gate 21 short and locating gate 21 close to cavity 24. To facilitate a short gate 21, gate plate 20 is of thin construction relative to the overall height of mold 100. It has been found that a gate plate 20 of about 0.25 inches in thickness is suitable for use in a method and apparatus for injection molding a package around an LED. The addition of runner 25 in the top of gate plate 20 allows the length of gate 21 to be further reduced. A gate 21 of about 0.065 inches in length from input to output is well suited for use in encapsulating LEDs. The shorter gate provides an additional advantage in that the thermoplastic material may be maintained at a higher temperature because the short distance from the heating elements to the cavity prevents substantial cooling. The higher temperature results in a thermoplastic with a lower viscosity which improves the injection process further and results in less damage to delicate devices and connections.

The small size of gates 21 and cavities 24 and their proximity to one another also results in a gate plate that may wear significantly with repeated use, eventually allowing leakage between the cavity segments. Use of a thin gate plate 20 that is separate from the larger top and bottom plates (10 and 40) of mold 100, however, allows design of a replaceable gate plate which may be constructed of relatively inexpensive material relative to the other components of mold 100.

Referring to FIG. 2K, the shape of cavity 24 and gate 21 may be seen in detail. The shape of cavity 24 is chosen to provide a package of hardened encapsulating material (34 of FIG. 2D) that completely encloses LED 32 and fills hole 31. Cavity 24 may, however, be of any shape, and the shape will depend on the particular device being enclosed. The cavity may, for example, be substantially rectangular, or round, or trapezoidal at its base and taper to the output of its corresponding gate which itself may be, for example, round, square, triangular, rectangular, or oval. As shown, gate 21 is conical in shape with a substantially round input and substantially round output. However, gate 21 also may be of any shape and may, for example, be pyramid-shaped, substantially rectangular in cross-section, or the like.

A further advantage to the use of gate plate 20 is the versatile placement of gates 21 and cavities 24. Because they are formed entirely in gate plate 20, gates 21 and cavities 24 may be located anywhere in gate plate 20. Further, all of the gates may be fed from the same distribution runner which may be located in gate plate 20 or in top plate 10. Accordingly, the devices to be encapsulated may be located in any configuration on substrate 30. The need for a lead frame to hold the devices is thus eliminated. These devices may even be located near or around other devices that have previously been encapsulated or mounted to substrate 30 by providing cut outs in gate plate 20 to accommodate these other devices. The small size of gate 21 and cavity 24 and versatility of replaceable gate plate 20, allow for very accurate placement of an encapsulating material and thus allow for a large number of small devices to be individually encapsulated in close proximity to one another and in any location or arrangement on a substrate.

Referring to FIG. 2B, once the encapsulating material has hardened, top plate 10 is removed from gate plate 20. Ejection pins 41 are automatically released by the removal of the weight of top plate 10 and spring upward, ejecting the excess hardened encapsulating material 50 off of gate plate 20. The excess hardened encapsulating material 50 breaks off near output 23 (FIG. 2H) under the pressure from ejection pins 41. Thus, substantially all of the excess hardened encapsulating material outside of cavity 24 is automatically removed when the mold is opened, eliminating the need for any additional milling or polishing step. Excess hardened encapsulating material 50 may be recycled by being reheated and then used to encapsulate additional devices.

Referring to FIG. 2M, cavity 24 encloses LED 32 and its adjacent hole 31. As shown in FIG. 2M and discussed above, after injection, the encapsulating material fills cavity 24 and hole 31 and fully encloses LED 32. Also as shown in FIG. 2M and discussed above, the hardened encapsulating material breaks off near output 23 of gate 21 when mold 100 is opened.

Referring to FIG. 2N, mold 100 is further opened by removing gate plate 20 and substrate 30 is thereafter removed from mold 100. The devices on substrate 30 are encapsulated by the hardened encapsulating material as show in FIG. 2D and discussed above.

Referring to FIG. 3, mold 100 is contained within injection molding apparatus 200. Injection molding apparatus 200 is of a type well-known in the art which is commercially available, for example, from Arburg, Inc. of Newington, Conn. Injection molding apparatus 200 generally includes hopper 201, screw 203, barrel 205, nozzle 207 and clamp 209. A mold, such as for example, mold 100, is secured under pressure in clamp 209. In normal operation, the raw encapsulating material (not shown) to be injected is placed in hopper 201 and a portion of this material enters barrel 205. Screw 203 rotates inside barrel 205. This rotation works the encapsulating material into the proper molten state through friction and the application of heat. The rotation of screw 203 also works the encapsulating material through barrel 205 toward nozzle 207. Once the encapsulating material is in the proper state, screw 203 is translated along barrel 205 applying pressure to the encapsulating material and forcing it through nozzle 207 into mold 100.

The present invention has been described in terms of specific embodiments. The invention, however, is not limited to these specific embodiments. Rather, the scope of the invention is defined by the following claims, and other embodiments are within the scope of the claims.

What is claimed is:

1. An alphanumerical display, comprising:

a set of light emitting diodes mounted directly to a printed circuit board; and a hole through the printed circuit board adjacent to each of the light emitting diodes, the light emitting diodes and holes being arranged to form a display;

wherein each of the light emitting diodes is separately encapsulated in a package of light-transmissive thermoplastic material that has been molded onto and mechanically bonded to the printed circuit board.

2. The display of claim 1, wherein the package of thermoplastic material has been injection molded onto the printed circuit board.

3. The display of claim 1, wherein the package is shaped to focus and reflect light from the light emitting diode out its adjacent hole.

4. The display of claim 1, wherein each hole is completely filled with the encapsulating material such that the encapsulating material on the side of the printed circuit board opposite from the light emitting diodes is substantially flat and flush with the surface of the printed circuit board.

5. The display of claim 1, wherein the holes are lozenge shaped and arranged to form a seven-segment display.

* * * * *